(12) United States Patent
Wu et al.

US011710659B2

(10) Patent No.: US 11,710,659 B2
(45) Date of Patent: **\*Jul. 25, 2023**

(54) METAL LOSS PREVENTION USING IMPLANTATION

(71) Applicant: Taiwan Semiconductor Manufacturing Co., Ltd., Hsinchu (TW)

(72) Inventors: Li-Chieh Wu, Hsinchu (TW); Tang-Kuei Chang, Tainan (TW); Kuo-Hsiu Wei, Tainan (TW); Kei-Wei Chen, Tainan (TW); Ying-Lang Wang, Tien-Chung Village (TW); Su-Hao Liu, Jhongpu Township (TW); Kuo-Ju Chen, Taichung (TW); Liang-Yin Chen, Hsinchu (TW); Huicheng Chang, Tainan (TW); Ting-Kui Chang, New Taipei (TW); Chia Hsuan Lee, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/646,024

(22) Filed: Dec. 27, 2021

(65) Prior Publication Data
US 2022/0122884 A1    Apr. 21, 2022

Related U.S. Application Data

(60) Continuation of application No. 16/556,360, filed on Aug. 30, 2019, now Pat. No. 11,211,289, which is a
(Continued)

(51) Int. Cl.
*H01L 21/768* (2006.01)
*H01L 23/522* (2006.01)
(Continued)

(52) U.S. Cl.
CPC .. *H01L 21/76883* (2013.01); *H01L 21/76825* (2013.01); *H01L 23/5226* (2013.01);
(Continued)

(58) Field of Classification Search
CPC ........ H01L 21/76883; H01L 21/76825; H01L 23/5226; H01L 21/31155; H01L 21/76802;
(Continued)

(56) References Cited

U.S. PATENT DOCUMENTS 10,643,892 B2 *   5/2020   Wu .................... H01L 21/7684
2010/0059889 A1 *  3/2010   Gosset ............. H01L 23/53295
                                                          438/778
(Continued)

FOREIGN PATENT DOCUMENTS

CN          103794584 A       5/2014

*Primary Examiner* — Patricia D Valenzuela
(74) *Attorney, Agent, or Firm* — Slater Matsil, LLP

(57) ABSTRACT

The present disclosure provides methods for forming conductive features in a dielectric layer without using adhesion layers or barrier layers and devices formed thereby. In some embodiments, a structure comprising a dielectric layer over a substrate, and a conductive feature disposed through the dielectric layer. The dielectric layer has a lower surface near the substrate and a top surface distal from the substrate. The conductive feature is in direct contact with the dielectric layer, and the dielectric layer comprises an implant species. A concentration of the implant species in the dielectric layer has a peak concentration proximate the top surface of the dielectric layer, and the concentration of the implant species decreases from the peak concentration in a direction towards the lower surface of the dielectric layer.

20 Claims, 18 Drawing Sheets

Related U.S. Application Data division of application No. 15/993,768, filed on May 31, 2018, now Pat. No. 10,643,892.

(51) Int. Cl.
| | |
|---|---|
| *H01L 29/66* | (2006.01) |
| *H01L 29/78* | (2006.01) |
| *H01L 23/485* | (2006.01) |
| *H01L 21/3115* | (2006.01) |
| *H01L 23/532* | (2006.01) |

(52) U.S. Cl.
CPC ... *H01L 21/31155* (2013.01); *H01L 21/76802* (2013.01); *H01L 21/76877* (2013.01); *H01L 21/76886* (2013.01); *H01L 23/485* (2013.01); *H01L 23/5329* (2013.01); *H01L 23/53295* (2013.01); *H01L 29/66795* (2013.01); *H01L 29/785* (2013.01); *H01L 2029/7858* (2013.01)

(58) Field of Classification Search
CPC ............. H01L 21/76877; H01L 23/485; H01L 23/5329; H01L 29/66795; H01L 29/785; H01L 2029/7858; H01L 21/7684; H01L 21/76879; H01L 21/76822; H01L 21/76837; H01L 21/76886; H01L 23/53295

See application file for complete search history.

(56) References Cited

U.S. PATENT DOCUMENTS

| | | |
|---|---|---|
| 2012/0126414 A1 | 5/2012 | Arai |
| 2013/0299987 A1 | 11/2013 | Lin et al. |
| 2016/0141394 A1 | 5/2016 | Lu et al. |
| 2017/0025535 A1* | 1/2017 | Wu ..................... H01L 29/785 |

* cited by examiner

METAL LOSS PREVENTION USING IMPLANTATION

PRIORITY CLAIM AND CROSS-REFERENCE

This application is a continuation of U.S. patent application Ser. No. 16/556,360, entitled "Metal Loss Prevention Using Implantation," filed on Aug. 30, 2019, now U.S. Pat. No. 11,211,289, which is a divisional of U.S. patent application Ser. No. 15/993,768, entitled "Metal Loss Prevention Using Implantation," filed on May 31, 2018, now U.S. Pat. No. 10,643,892, each application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
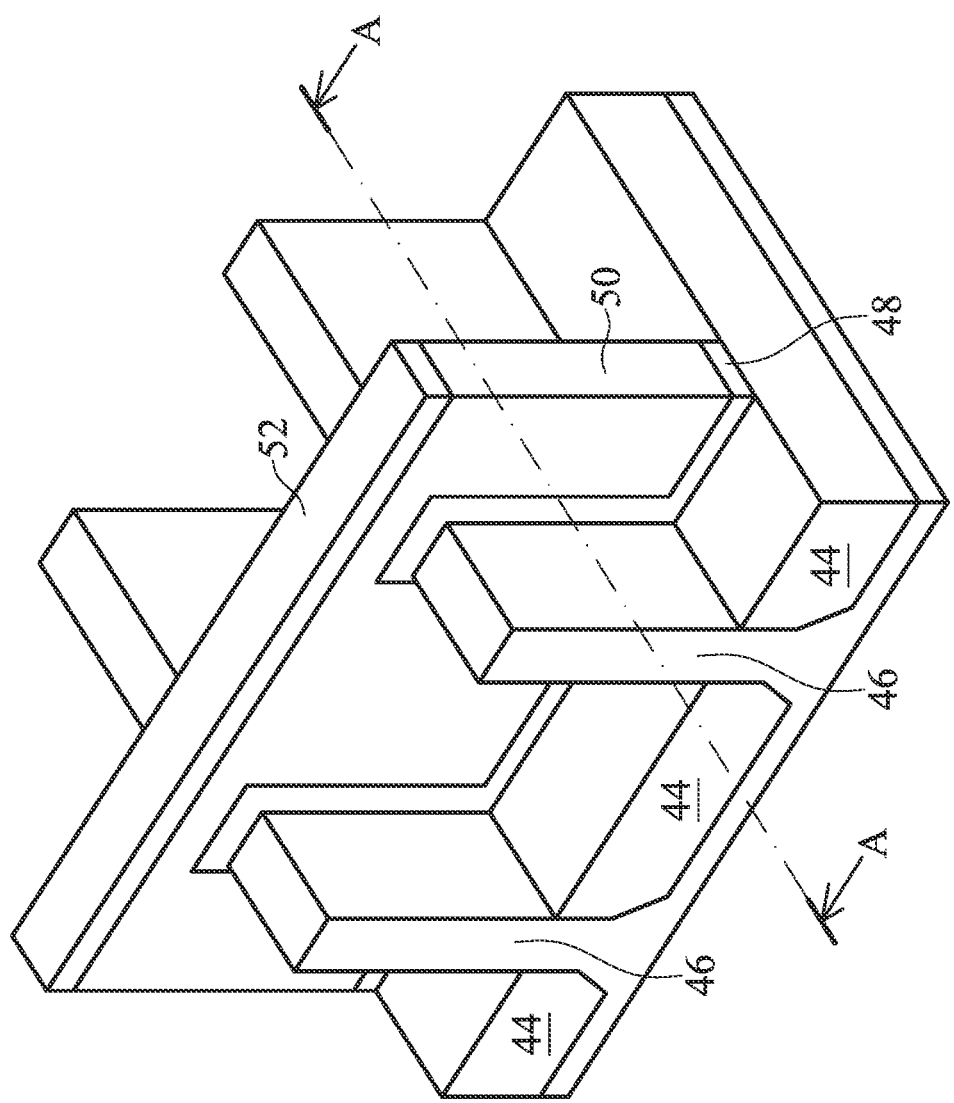
FIG. 1 is a three-dimensional view of an intermediate structure at a stage during an example method for forming a conductive feature in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides methods for forming conductive features in a semiconductor device and the conductive features formed thereby. Particularly, some embodiments provide a method for forming a conductive plug in an interlayer dielectric to connect with a conductive structure under the interlayer dielectric. The method includes filling an opening through an interlayer dielectric with a conductive fill material without using an adhesion layer or a barrier layer, and with implanting the interlayer dielectric to eliminate gaps and cracks between the conductive fill material and the interlayer dielectric. The implantation can create compression stress between the conductive fill material and the interlayer dielectric to close gaps and cracks between the materials, thus, preventing loss of the conductive structure under the conductive fill material during a subsequent planarization process, such as a chemical mechanical polishing (CMP) process. Embodiments can be used in any suitable situations to remove gaps between two materials.

Example embodiments described herein are described in the context of forming conductive features in Back End of the Line (BEOL) and/or Middle End of the Line (MEOL) processing. Embodiments described herein are in the context of forming a conductive feature to a Fin Field Effect Transistor (FinFET) (e.g., to a gate structure of a FinFET). Other embodiments may be implemented in other contexts, such as with different devices, such as planar Field Effect Transistors (FETs), Vertical Gate All Around (VGAA) FETs, Horizontal Gate All Around (HGAA) FETs, bipolar junction transistors (BJTs), diodes, capacitors, inductors, resistors, etc. In some embodiments, the conductive feature can be in an intermetallization dielectric in BEOL processing. Implementations of some aspects of the present disclosure may be used in other processes and/or in other devices.

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIG. 1 is a three-dimensional view of an intermediate structure at a stage during an example method for forming a conductive feature in accordance with some embodiments. FIGS. 2 through 9 illustrate cross-sectional views of respective intermediate structures at respective stages during the example method for forming a conductive feature in accordance with some embodiments.

The intermediate structure of FIG. 1, as described in the following, is used in the implementation of FinFETs. Other structures may be implemented in other example embodiments. The intermediate structure includes first and second fins 46 formed on a semiconductor substrate 42, with respective isolation regions 44 on the semiconductor substrate 42 between neighboring fins 46. The semiconductor substrate 42 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 42 may include an elemental semiconductor such as silicon (Si) or germanium (Ge); a compound semiconductor; an alloy semiconductor; or a combination thereof.

The fins 46 are formed on the semiconductor substrate 42, such as by etching trenches in the semiconductor substrate 42 to form the fins 46. The fins 46 may be patterned in the semiconductor substrate 42 by any suitable method. For example, the fins 46 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 46.

Isolation regions 44 are formed with each being in a corresponding trench. The isolation regions 44 may include or be an insulating material such as an oxide (such as silicon oxide), a nitride, the like, or a combination thereof, and the insulating material may be deposited using an appropriate deposition process. The insulating material may be recessed after being deposited to form the isolation regions 44. The insulating material is recessed such that the fins 46 protrude from between neighboring isolation regions 44, which may, at least in part, thereby delineate the fins 46 as active areas on the semiconductor substrate 42. Further, top surfaces of the isolation regions 44 may have a flat surface as illustrated, a convex surface, a concave surface (such as dishing), or a combination thereof, which may result from an etch process. A person having ordinary skill in the art will readily understand that the processes described above are just examples of how fins 46 may be formed. In other examples, the fins 46 may be formed by other processes and may include heteroepitaxial and/or homoepitaxial structures.

In the embodiment shown in FIG. 1, a dummy gate stack is formed along respective sidewalls of and over the fins 46. The dummy gate stack is for a replacement gate process, as described herein. The dummy gate stack extends longitudinally perpendicularly to respective longitudinal directions of the fins 46. The dummy gate stack includes an interfacial dielectric 48 along and on the fins 46, a dummy gate 50 over the interfacial dielectric 48, and a mask 52 over the dummy gate 50.

The interfacial dielectric 48 may include or be silicon oxide, silicon nitride, the like, or multilayers thereof. The dummy gate 50 may include or be silicon (e.g., polysilicon) or another material. The mask 52 may include or be silicon nitride, silicon oxynitride, silicon carbon nitride, the like, or a combination thereof. Layers for the interfacial dielectric 48, dummy gate 50, and mask 52 for the dummy gate stack may be sequentially deposited or formed, such as by any acceptable deposition technique, and then patterned, for example, using photolithography and one or more etch processes, into the dummy gate stack.

Figure 2:
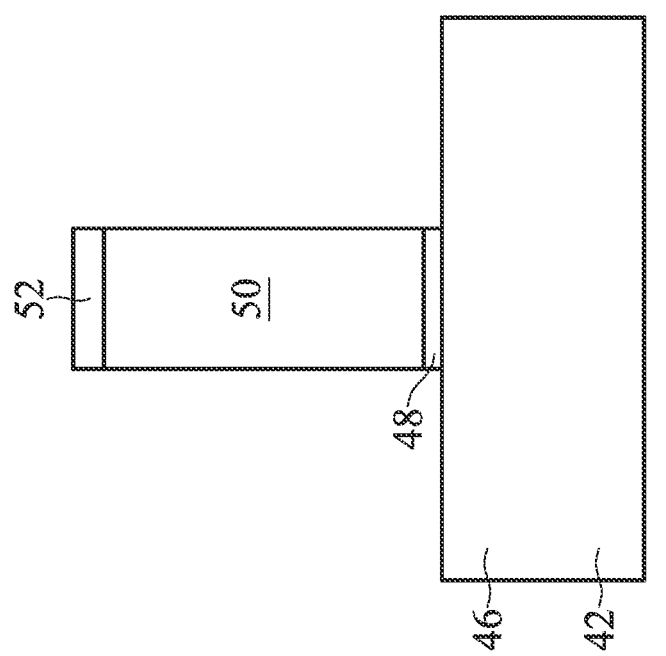
FIGS. 2 through 9 are cross-sectional views of respective intermediate structures at respective stages during the example method for forming a conductive feature in accordance with some embodiments.

FIG. 1 further illustrates a reference cross-section that is used in later figures. Cross-section A-A is in a plane along, e.g., channels in the fin 46 between opposing source/drain regions. FIGS. 2 through 9 illustrate cross-sectional views at various stages of processing in the example method corresponding to cross-section A-A. FIG. 2 illustrates a cross-sectional view of the intermediate structure of FIG. 1 at the cross-section A-A.

Figure 3:
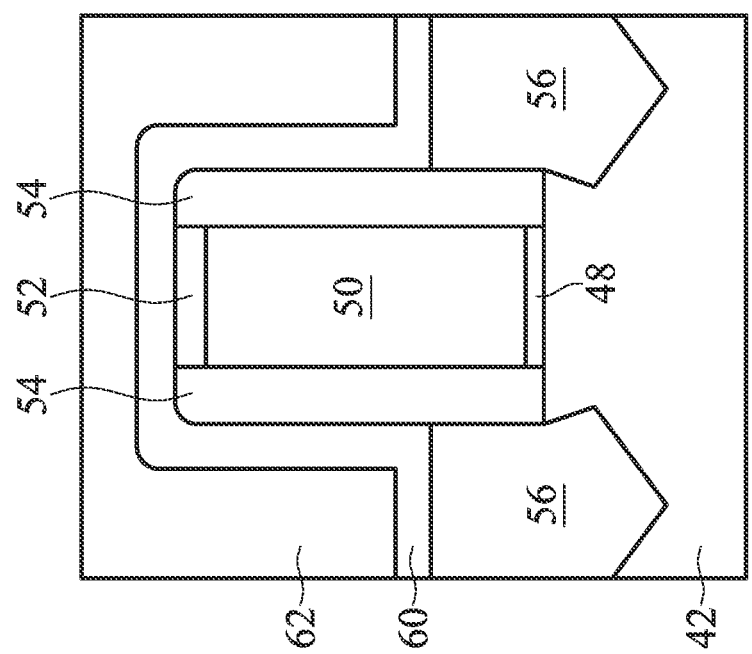

FIG. 3 illustrates the formation of gate spacers 54, epitaxy source/drain regions 56, a contact etch stop layer (CESL) 60, and a first interlayer dielectric (ILD) 62. The gate spacers 54 are formed along sidewalls of the dummy gate stack (e.g., sidewalls of the interfacial dielectrics 48, dummy gates 50, and masks 52) and over the fins 46. The gate spacers 54 may be formed by conformally depositing one or more layers for the gate spacers 54 and anisotropically etching the one or more layers, for example. The one or more layers for the gate spacers 54 may include or be silicon nitride, silicon oxynitride, silicon carbon nitride, the like, multi-layers thereof, or a combination thereof.

After formation of the gate spacers 54, recesses are formed in the fins 46 on opposing sides of the dummy gate stack (e.g., using the dummy gate stack and gate spacers 54 as a mask) by an etch process. The epitaxy source/drain regions 56 are formed in the recesses by an appropriate epitaxial growth or deposition process. The epitaxy source/drain regions 56 may include or be silicon germanium, silicon carbide, silicon phosphorus, silicon carbon phosphorus, pure or substantially pure germanium, a III-V compound semiconductor, a II-VI compound semiconductor, or the like. In some embodiments, the recessing and epitaxial growth may be omitted, and the source/drain regions may be formed by implanting dopants into the fins 46 using the dummy gate stack and gate spacers 54 as masks.

After formation of the source/drain regions 56, the CESL 60 is conformally deposited, by an appropriate deposition process, on surfaces of the epitaxy source/drain regions 56, sidewalls and top surfaces of the gate spacers 54, top surfaces of the masks 52, and top surfaces of the isolation regions 44. Generally, an etch stop layer (ESL) can provide a mechanism to stop an etch process when forming, e.g., contacts or vias. An ESL may be formed of a dielectric material having a different etch selectivity from adjacent layers or components. The CESL 60 may comprise or be silicon nitride, silicon carbon nitride, silicon carbon oxide, carbon nitride, the like, or a combination thereof.

The first ILD 62 is then deposited, by an appropriate deposition process, on the CESL 60. The first ILD 62 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, silicon carbon material, a compound thereof, a composite thereof, the like, or a combination thereof.

Figure 4:
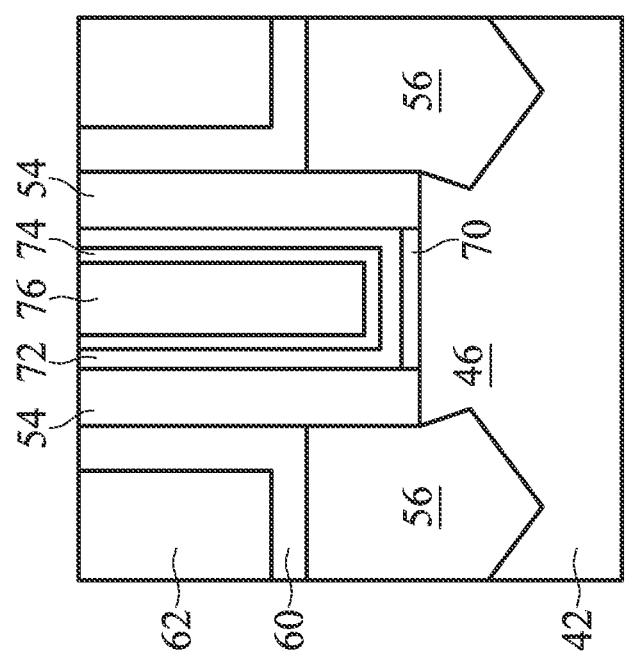

In FIG. 4, a planarization process, such as a CMP, may be performed to level the top surfaces of the first ILD 62 and CESL 60 with the top surface of the dummy gate 50. The dummy gate 50 is removed by one or more etch processes. A replacement gate structure is formed in the recess where the dummy gate stack was removed. The replacement gate structure includes, as illustrated, an interfacial dielectric 70, a gate dielectric layer 72, one or more optional conformal layers 74, and a gate conductive fill material 76. The interfacial dielectric 70 is formed on sidewalls and top surfaces of the fins 46 along the channel regions. The interfacial dielectric 70 can be, for example, the interfacial dielectric 48 if not removed, an oxide (e.g., silicon oxide) formed by thermal or chemical oxidation of the fin 46, and/or an oxide (e.g., silicon oxide), nitride (e.g., silicon nitride), and/or another dielectric layer.

The gate dielectric layer 72 can be conformally deposited in the recesses where dummy gate stack was removed (e.g., on top surfaces of the isolation regions 44, on the interfacial dielectric 70, and sidewalls of the gate spacers 54) and on the top surfaces of the first ILD 62, the CESL 60, and gate spacers 54. The gate dielectric layer 72 can be or include silicon oxide, silicon nitride, a high-k dielectric material, multilayers thereof, or other dielectric material. A high-k dielectric material may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

Then, the one or more optional conformal layers 74 can be conformally (and sequentially, if more than one) deposited on the gate dielectric layer 72. The one or more optional conformal layers 74 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layer may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

The gate conductive fill material 76 is formed over the one or more optional conformal layers 74 (e.g., over the one or more work-function tuning layers), if implemented, and/or the gate dielectric layer 72. The gate conductive fill material 76 can fill the remaining recess where the dummy gate stack was removed. The gate conductive fill material 76 may be or comprise a metal-containing material such as tungsten, cobalt, aluminum, ruthenium, copper, multi-layers thereof, a combination thereof, or the like. Portions of the gate conductive fill material 76, one or more optional conformal layers 74, and gate dielectric layer 72 above the top surfaces of the first ILD 62, the CESL 60, and gate spacers 54 are removed, such as by a CMP. The replacement gate structure comprising the gate conductive fill material 76, one or more optional conformal layers 74, gate dielectric layer 72, and interfacial dielectric 70 may therefore be formed as illustrated in FIG. 4.

Figure 5:
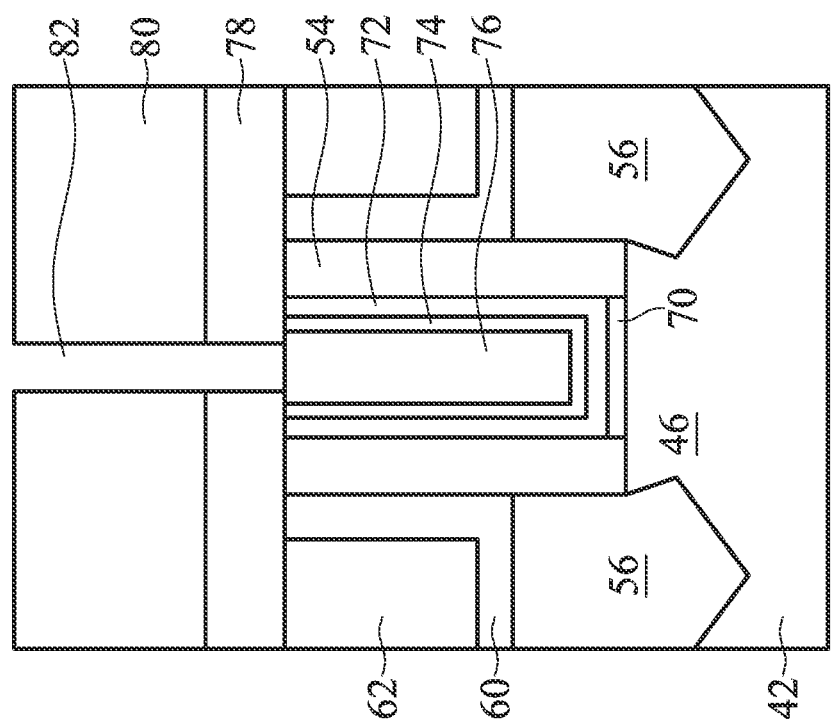

In FIG. 5, an ESL (etch stop layer) 78 is deposited over the first ILD 62, CESL 60, gate spacers 54, and replacement gate structure. The ESL 78 may comprise or be silicon nitride, silicon carbon nitride, carbon nitride, the like, or a combination thereof. In some embodiments, the ESL 78 has a thickness in a range from about 20 Å to about 500 Å, for example about 200 Å.

A second ILD 80 is deposited over the ESL 78. The second ILD 80 may comprise or be silicon dioxide, a low-k dielectric material, silicon oxynitride, PSG, BSG, BPSG, USG, FSG, OSG, $SiO_xC_y$, silicon carbon material, a compound thereof, a composite thereof, the like, or a combination thereof. In some embodiments, the second ILD 80 has a thickness in a range from about 20 Å to about 500 Å, for example about 350 Å. In some embodiments, the ESL 78 may not be implemented, and the second ILD 80 may be directly deposited on the first ILD 62, CESL 60, gate spacers 54, and replacement gate structure.

An opening 82 is then formed through the second ILD 80 and the ESL 78 to expose at least a portion of the replacement gate structure. The second ILD 80 and the ESL 78 may be patterned with the opening 82, for example, using photolithography and one or more etch processes.

Figure 6:
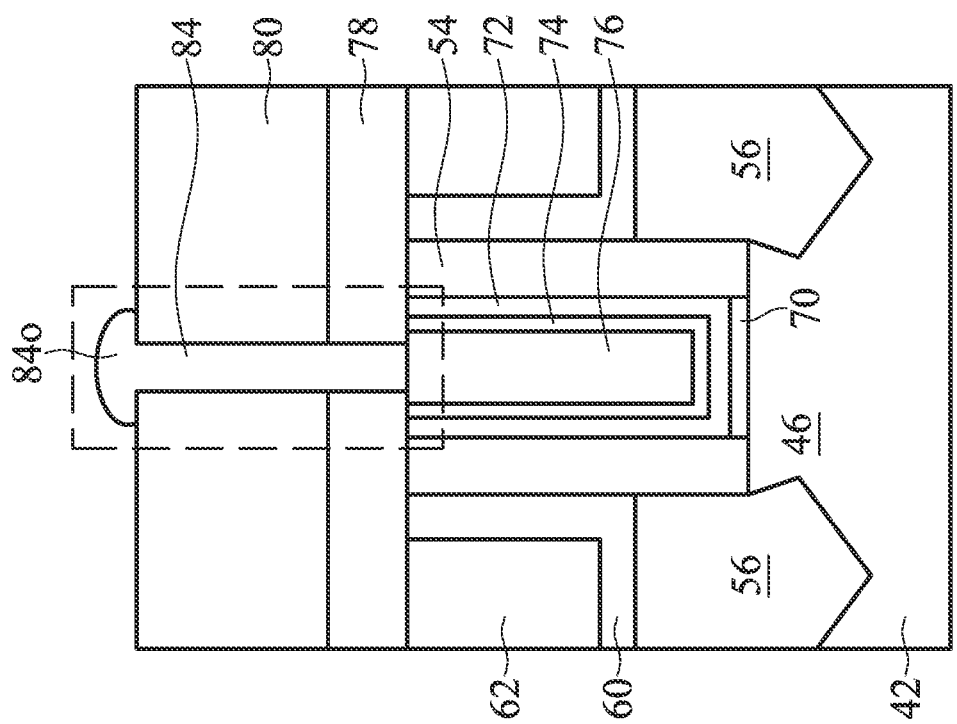

In FIG. 6, a conductive feature 84 is formed in the opening 82. The conductive feature 84 is formed directly in the opening 82 to connect with the replacement gate structure without using any adhesion layer and/or barrier layer in between. The conductive feature 84 is grown on a top surface of the gate conductive fill material 76, gradually filling the opening 82 from the bottom in a bottom-up manner. After filling the opening 82, the conductive feature 84 "spills" out the opening 82 forming an overfill portion 84o. The overfill portion 84o is above the top surface of the second ILD 80. The overfill portion 84o generally has a larger diameter than the opening 82. The bottom-up formation enables direct connection between the conductive feature 84 and the gate conductive fill material 76, which may reduce connection resistance. The bottom-up manner filling may also reduce undesired defects, such as voids or seams. For example, voids or seams may be avoided because the likelihood of early closure of the opening 82 can be reduced because of the bottom-up formation.

In some embodiments, the conductive feature 84 can be deposited in the opening 82 by chemical vapor deposition (CVD), selective atomic layer deposition (ALD), electroless deposition (ELD), electroplating, physical vapor deposition (PVD), or another deposition technique. In some embodiments, the bottom-up formation of the conductive feature 84 is achieved by PVD sputtering. In other embodiments, the bottom-up formation of the conductive feature 84 is achieved by using a self-alignment monolayer (SAM) inhibitor on dielectric surfaces while performing CVD growth over conductive surfaces. In some embodiments, the conductive feature 84 may be or comprise tungsten (W), cobalt (Co), copper (Cu), ruthenium (Ru), aluminum (Al), gold (Au), silver (Ag), alloys thereof, the like, or a combination thereof.

Figure 10:
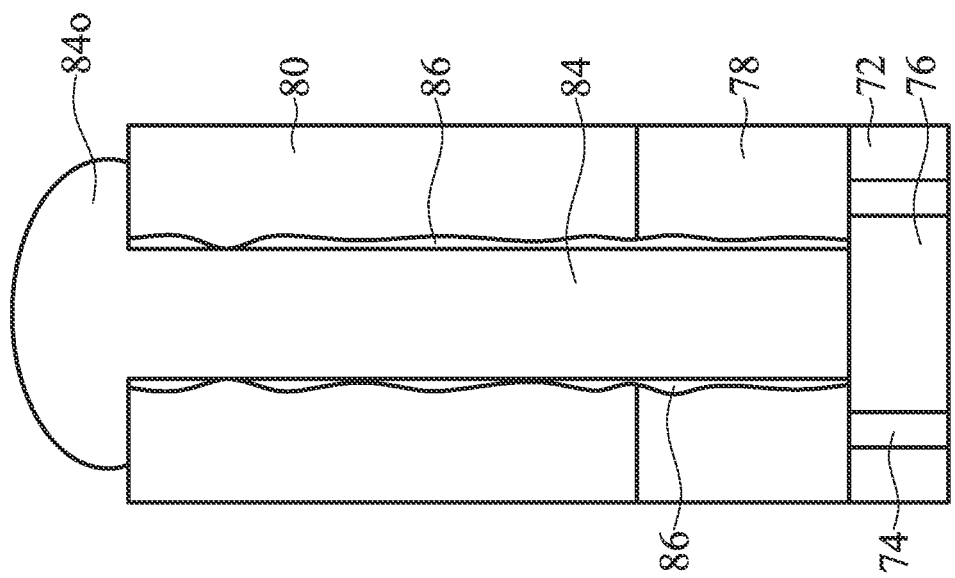
FIG. 10 is a partial enlarged view of FIG. 6.

FIG. 10 is a partial enlarged view of FIG. 6 showing details around the conductive feature 84. Because of the absence of any adhesion layer or barrier layer between the conductive feature 84 and the second ILD 80, gaps 86 can exist between the conductive feature 84 and the second ILD 80. The gaps 86 may cause unwanted behaviors in subsequent processes. For example, process chemistries from subsequent processes can penetrate through the gaps 86 and interact with the underlying materials. The conductive material, such as copper or cobalt, in the underlying material may be corroded by chemical attack in an acidic environment and degrade the electrical properties of the device. For example, in a subsequent CMP process, the gaps 86 can permit polishing slurry to penetrate to the underlying layers, such as the gate conductive fill material 76. The polishing slurry can react with the gate conductive fill material 76 causing loss of the gate conductive fill material 76. Similarly, the gaps 86 can also expose the underlying layers to etch chemistries, plasma processing environment in the subsequent processes. In some embodiments, the gaps 86 are reduced or closed by one or more implantation processes.

Generally, in some embodiments, a conductive feature is first formed in an interlayer dielectric layer without using any adhesion layer or barrier layer, and an implantation process is then performed to apply a compression between the conductive feature and interlayer dielectric layer to close any gaps due to the absence of the adhesion layer or barrier layer.

Figure 7:
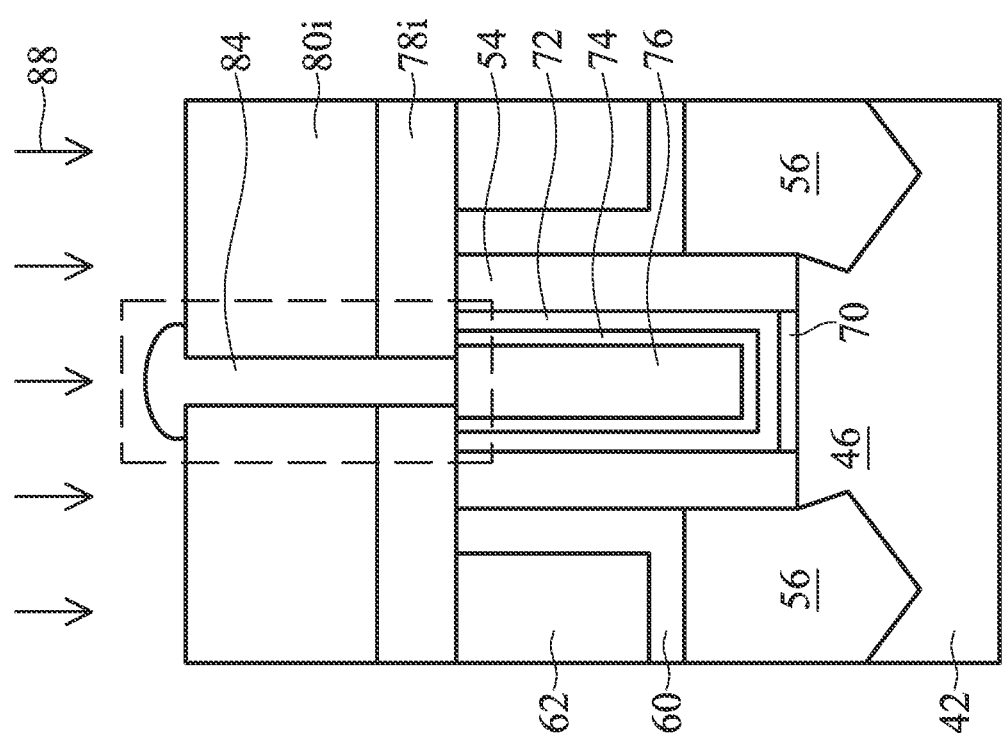

FIG. 7 schematically demonstrates an implantation process to eliminate or reduce the gaps 86 between the conductive feature 84 and the surrounding dielectric material, such as the second ILD 80 and the ESL 78. In some embodiments, after formation of the conductive feature 84, ion beams 88 of one or more species of neutral elements are projected towards the dielectric material, such as the second ILD 80 and the ESL 78, by an implantation process. In some embodiments, the neutral elements are implanted to the second ILD 80 and the ESL 78 to modify physical properties, such as volume and stress, but without significantly altering the one or more species of neutral elements are implanted at a desired depth and at desired concentration to close the path from the top surface to layers under the conductive features 84. In some embodiments, the one or more specimens of neutral elements include germanium (Ge), silicon (Si), nitrogen (N), or other elements with a larger atomic volume than the material being implanted.

In some embodiments, the implantation process is performed at an energy level in a range from about 10 k eV to about 80 k eV depending on the design, such as the original thickness and final thickness of the second ILD 80. With other parameters unchanged, a higher energy level leads to a deeper implantation peak. In some embodiments, the implantation process is performed at a dosage level in a range from about $5 \times 10^{13}$ counts/$cm^2$ to about $5 \times 10^{16}$ counts/$cm^2$, which may depend on the dimension of gaps to be closed. A higher dosage can correspond to a larger expansion in the dielectric layers to close a larger gap. In some embodiments, the implantation process is performed at a temperature in a range from about −100° C. to about 450° C. Optionally, an anneal process is performed after the implantation process to adjust a crystalline structure and reduce damage caused by the implantation process in the implanted layers.

Figure 11:
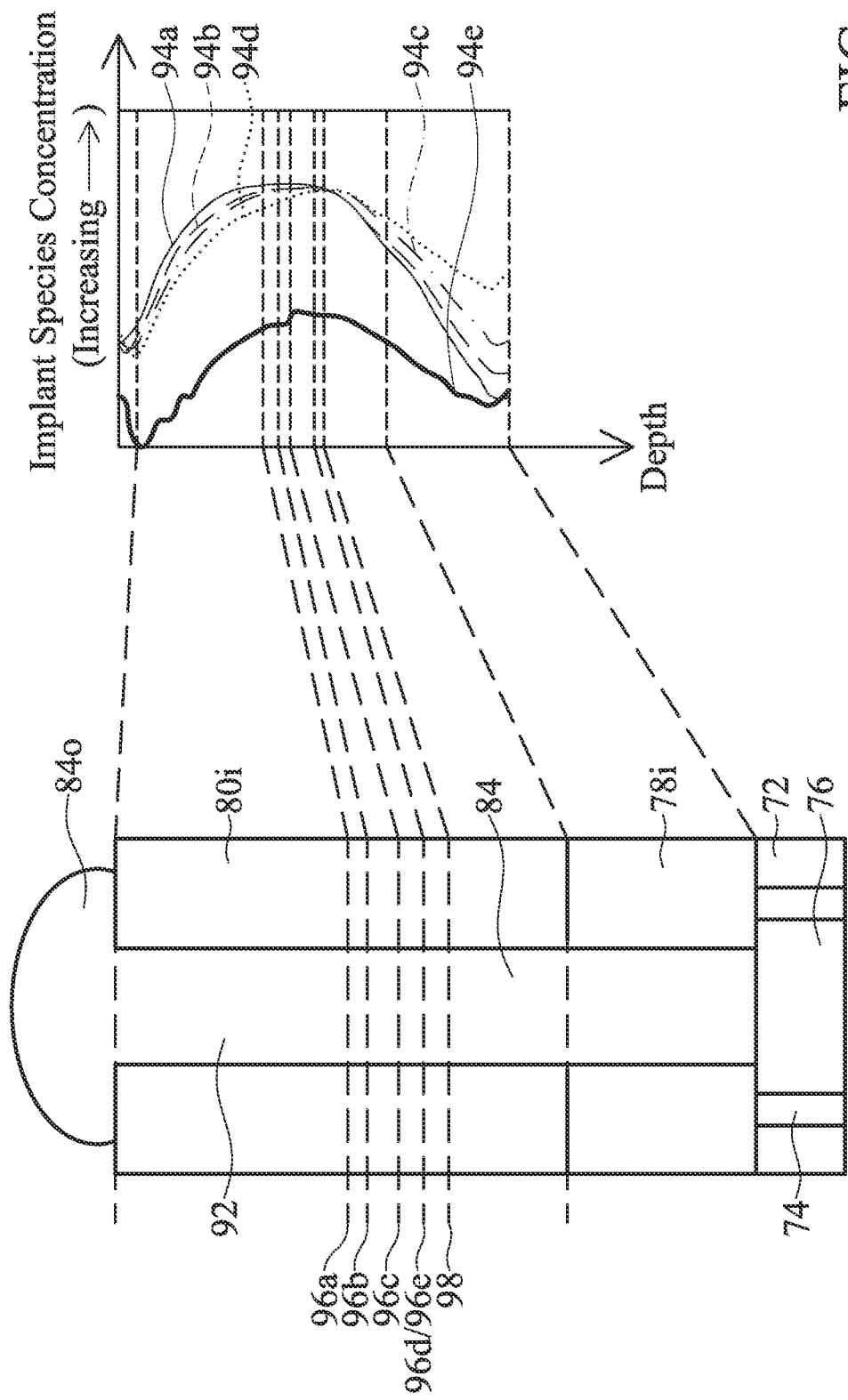
FIG. 11 is a partial enlarged view of FIG. 7.

FIG. 11 is a partial enlarged view of FIG. 7 showing the details around the conductive feature 84 after the implantation process. The species implanted in the implanted second ILD 80i and the implanted ESL 78i cause the implanted second ILD 80i and the implanted ESL 78i to expand. The expansion can occur in all directions. As shown in FIG. 11, the expansion induces compression at an interface 92 between (i) the conductive feature 84 and (ii) the implanted second ILD 80i or implanted ESL 78i to close the gaps 86. The expansion can occur along the z-direction, which is along the direction of depth. In some embodiments, the expansion along the z-direction may be measured to indicate the overall amount of expansion thus determining the compression between the conductive feature 84 and the dielectric layers.

Concentration profiles 94a-96e are implant species concentration profiles along the depth of the implanted second ILD 80i and the implanted ESL 78i in a few examples of Ge implantation. Concentration profiles 94a-94d are profiles of implantation processes performed using the same dosage and increasing power levels. Points 96a-96d are peak concentration points of the corresponding concentration profiles 94a-94d. Concentration profiles 94a-94d show that the peak concentration point deepens with increasing power level when dosage remains constant. Concentration profile 94e is a profile of implantation processes performed using the same power level and a lower dosage as in concentration profile 94d. Concentration profiles 94e and 94d have substantially the same shape.

The implant species concentration is the highest at the peak concentration point 96a-96e, where the induced compression towards the conductive feature 84 is also likely to be the highest. Line 98 indicates a depth level where a subsequent CMP process ends. The portion of the second ILD 80 under the line 98 remains in the device while the portion of the second ILD 80 above the line 98 is removed during the process. In some embodiments, the implantation process is designed so that the peak concentration point is at a depth level above the line 98. The configuration can ensure that the portion of the second ILD 80 interacting with the CMP slurry has high compression towards the conductive feature 84 to cut off the path of the slurry to the underlying layers.

The conductive feature 84, having a denser crystalline structure than the second ILD 80, is more difficult for the implanted species to penetrate. As a result, the implanted species are concentrated in a shallower depth in the conductive feature 84 than in the second ILD 80. In some embodiments, the majority of the implanted species in the conductive feature 84 is above the line 98, and thus, will be removed by the planarization process.

In some embodiments, the ion beams 88 may be directed at an angle towards the substrate to direct species towards areas covered the by overfill portion 84o of the conductive feature 84.

Figure 8:
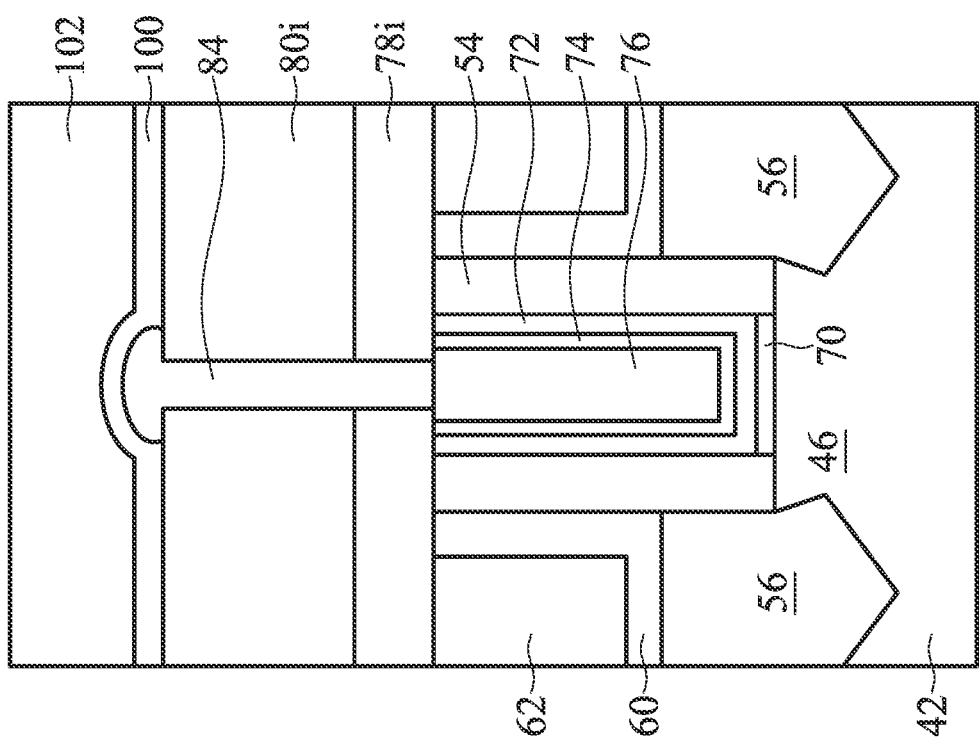

In FIG. 8, a barrier layer 100 is formed over the conductive feature 84 and remaining portions of the implanted second ILD 80i not covered by the conductive feature 84. The barrier layer 100 may be or comprise titanium nitride, titanium oxide, tantalum nitride, tantalum oxide, the like, or a combination thereof, and may be deposited by ALD, CVD, or another deposition technique. A blanket conductive layer 102 is then formed over the barrier layer 100. The blanket conductive layer 102 may fill up other recesses or openings in the second ILD 80. In some embodiments, the conductive layer 102 can be deposited by CVD, ALD, ELD, physical vapor deposition (PVD), electroplating, or another deposition technique. In some embodiments, the conductive layer 102 may be or comprise tungsten (W), cobalt (Co), copper (Cu), ruthenium (Ru), aluminum (Al), gold (Au), silver (Ag), alloys thereof, the like, or a combination thereof. In some embodiments, the conductive layer 102 and the conductive feature 84 may include the same material. The blanket conductive layer 102 also brings the surface of the substrate in a condition for a CMP process.

Figure 9:
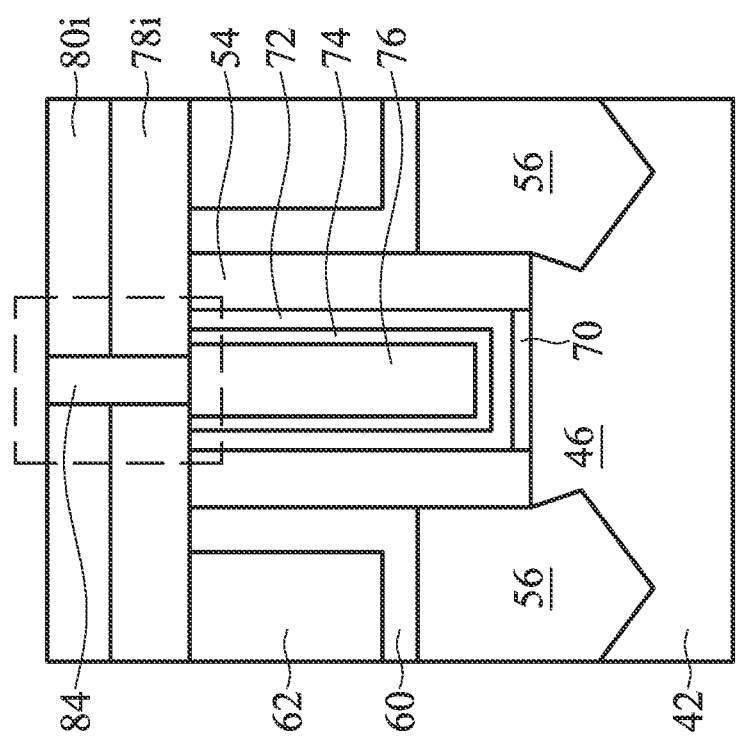

In FIG. 9, a planarization process, such as a CMP, is performed to remove excess amounts of the conductive layer 102, the barrier layer 100, the implanted second ILD 80i, and the conductive feature 84. In some embodiments, the implanted second ILD 80i has a thickness in a range between about 20 Å to about 500 Å, for example about 50 Å, after the planarization process. Because the implanted second ILD 80i and the implanted ESL 78i compress against the conductive feature 84, the CMP slurry may be prevented from penetrating to the gaps around the conductive feature 84 leaving the underlying layer undamaged.

Figure 12:
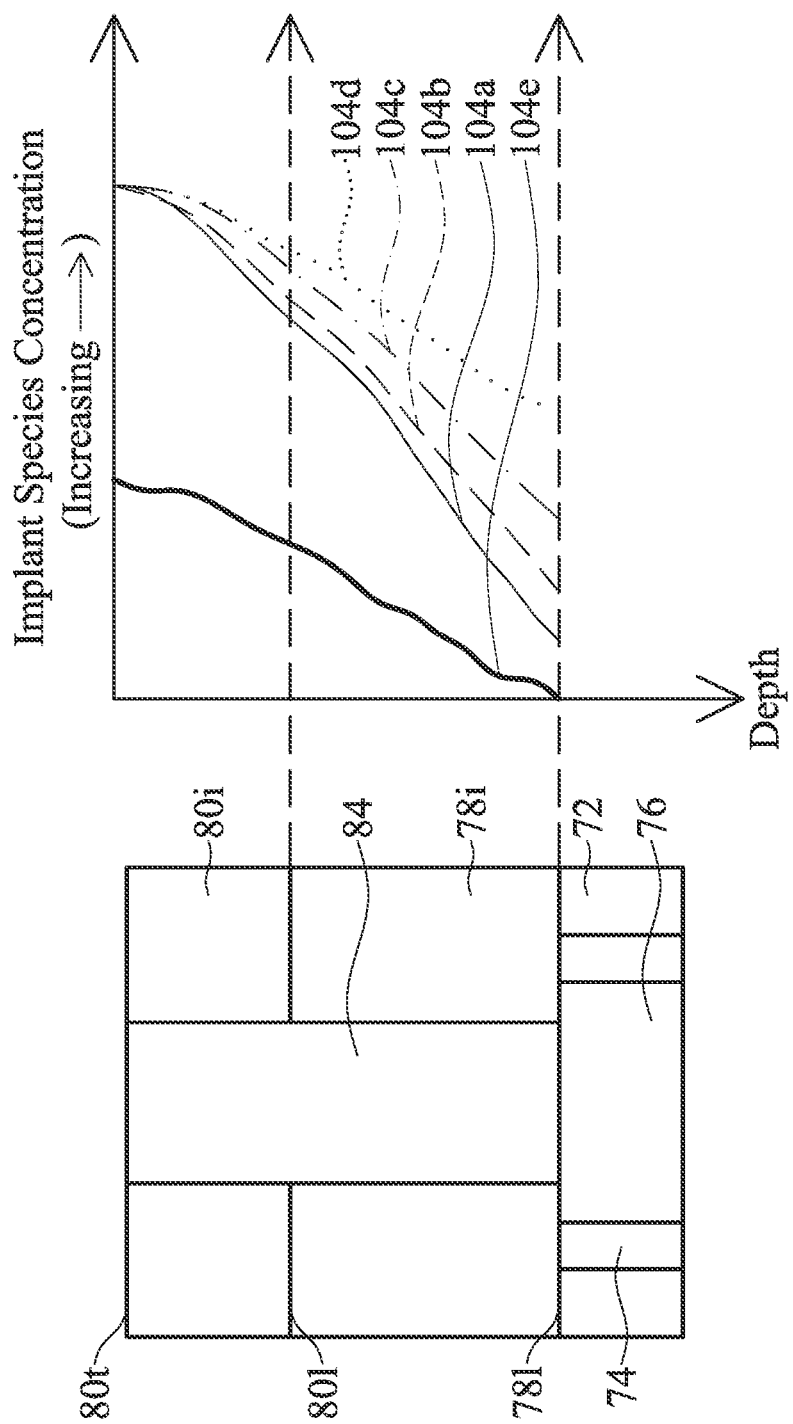
FIG. 12 is a partial enlarged view of FIG. 9.

FIG. 12 is a partial enlarged view of FIG. 9 showing features adjacent the conductive feature 84 after the planarization process. Concentration profiles 104a-104e are implant species concentration profiles in the implanted second ILD 80i and the implanted ESL 78i after the planarization process. In some embodiments, the implanted second ILD 80i and the implanted ESL 78i have an implant species concentration profile that is decreasing with depth. Particularly, after the planarization process, the implant species concentration profile decreases from a peak concentration of the implant species in the remaining implanted second ILD 80i and the implanted ESL 78i, which is proximate a top surface Bot of the remaining implanted second ILD 80i, in a direction towards underlying layers in the substrate, such as a lower surface 801 of the second ILD 80i and a lower surface 781 of the implanted ESL 78i. The surface of the implanted second ILD 80i being distal from the substrate. In some embodiments, the implanted second ILD 80i has an implant species concentration, such as Ge concentration, in a range from about $8\times10^{18}$ atoms/cm$^3$ to about $1\times10^{21}$ atoms/cm$^3$. In some embodiments, the implanted ESL 78i has an implant species concentration, such as Ge concentration, in a range from about $2\times10^{18}$ atoms/cm$^3$ to about $6\times10^{20}$ atoms/cm$^3$. Experiments indicate that the presence of the implanted species in the second ILD 80 generally do not have detectable effects in the insulating functions of the second ILD 80. Any remaining implanted species in the conductive feature 84 also generally does not affect the conductivity of the conductive feature 84.

FIGS. 13 through 16 are cross-sectional views of respective intermediate structures at respective stages during another example method for forming a conductive feature in accordance with some embodiments. Processing first proceeds as described above with respect to FIGS. 1 through 6 before proceeding to processing described below with respect to FIG. 13. FIGS. 13 through 16 illustrate cross-sectional views at various stages of processing in the example method corresponding to cross-section A-A.

Generally, in some embodiments, a conductive feature is first formed in an interlayer dielectric layer without using any adhesion layer or barrier layer, a first implantation process is then performed to apply a compression at a shallow depth between the conductive feature and interlayer dielectric layer to close any gaps, a first planarization process is then performed to remove overfill portions of the conductive features, a second implantation process is performed to apply a compression between the remaining conductive features and interlayer dielectric layer to close any gaps, and then a second planarization process is performed to remove any excess portions of the conductive features and the interlayer dielectric layer.

Figure 13:
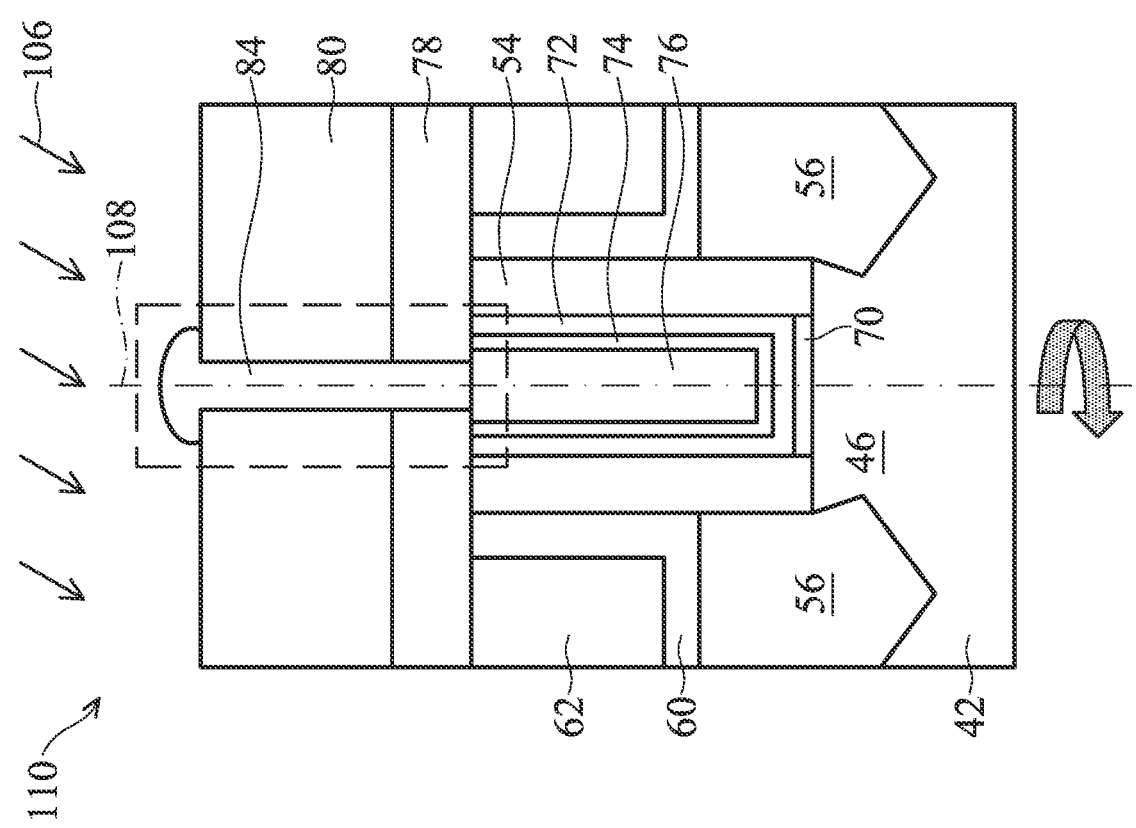
FIGS. 13 through 16 are cross-sectional views of respective intermediate structures at respective stages during another example method for forming a conductive feature in accordance with some embodiments.

In FIG. 13, a first implantation process is performed after the conductive feature 84 is formed as shown in FIGS. 2-6. The first implantation process is similar to the implantation process described with FIG. 7 except that the first implantation process is configured to have a shallower concentration peak point to prevent damage to the underlying layers while removing the overfill portion 84o of the conductive feature 84.

In some embodiments, after formation of the conductive feature 84, ion beams 106 of one or more species of neutral elements are projected towards the dielectric material, such as the second ILD 80 and the ESL 78, by an implantation process. The one or more species of neutral elements are implanted at a desired depth and at desired concentration to close the path from the top surface to layers under the conductive features 84. In some embodiments, the one or more species of neutral elements include germanium (Ge), silicon (Si), nitrogen (N), or other elements with a larger atomic volume than the material being implanted. The first implantation process is performed an energy level, a dosage, and an angle so that the gaps between the second ILD 80 immediately below the overfill portion 84o can be closed.

Because the overfill portion 84o is typically larger in diameter than the portion in the opening 82 and the conductive feature 84 generally has a much denser crystalline structure than the second ILD 80, the overfill portion 84o may act like an umbrella preventing implanted species from reaching the second ILD 80 below the overfill portion 84o. In some embodiments, the ion beams 106 may be directed towards the substrate at an angle to reach the second ILD 80 being shielded by the overfill portion 84o. In FIG. 13, the ion beam 106 is directed at an angle no relative to an axis 108, which is perpendicular to a top surface of the substrate. During operation, the substrate 42 is rotating, e.g., around the axis 108. As the substrate 42 rotates about the axis 108, the second ILD 80 under the overfill portion 84o around of the conductive feature 84 can be implanted by the ion beam 106 at the angle 110. In some embodiments, the angle 110 may be in a range from greater than 0 degrees to about 45 degrees.

In some embodiments, the first implantation process is performed at an energy level in a range from about 5 keV to about 40 keV. A higher energy level can correspond to a deeper implantation peak.

In some embodiments, the first implantation process is performed at a dosage level in a range from about $5\times10^{13}$ counts/cm$^2$ to about $5\times10^{16}$ counts/cm$^2$, which may depend on the dimension of gaps to be closed. A higher dosage corresponds to a larger expansion in the dielectric layers to close a larger gap.

In some embodiments, the first implantation process is performed at a temperature in a range from about −100° C. to about 450° C. Optionally, an anneal process is performed after the first implantation process to adjust a crystalline structure and reduce damage caused by the implantation process in the implanted layers.

Figure 17:
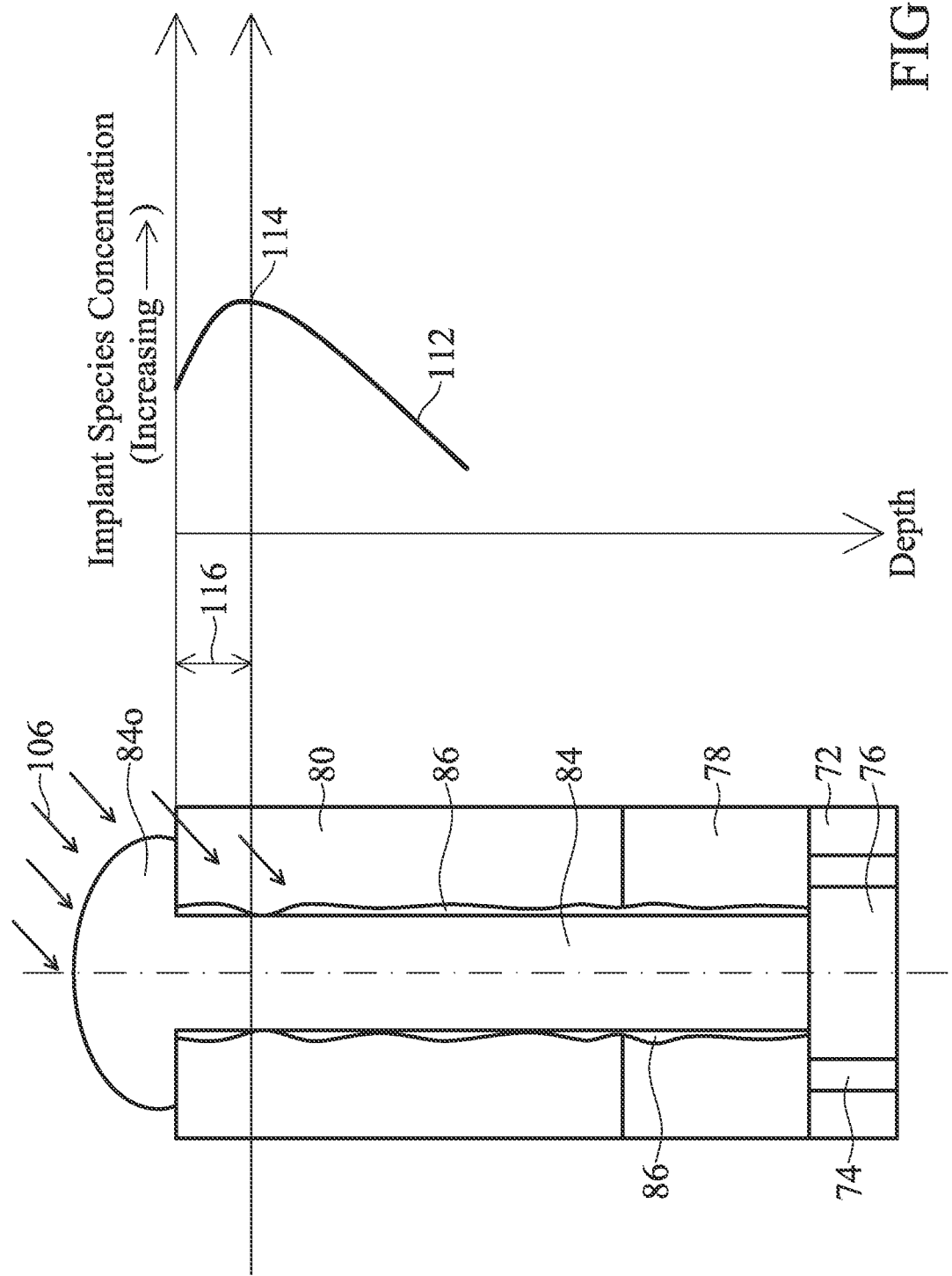
FIG. 17 is a partial enlarged view of FIG. 13.

FIG. 17 is a partial enlarged view of FIG. 13 showing details around the conductive feature 84 after the first implantation process. Concentration profile 112 is implant species concentration profile along the depth of the implanted second ILD 80i. Point 114 is a peak concentration point of the concentration profile 112. In some embodiments, the peak concentration point is at a distance 116 below the top surface of the second ILD 80. In some embodiments, the distance 116 is at a depth in a range from greater than about 0 Å to about 500 Å. The highest compression between the second ILD 80 and the conductive feature 84 may occur near the peak concentration point. The compression near the peak concentration point can cut of a path to the underlying layer through the gaps 86. When polishing above the peak concentration point, a CMP slurry may not be able to penetrate through the gaps 86 to reach the underlying layer.

Figure 14:
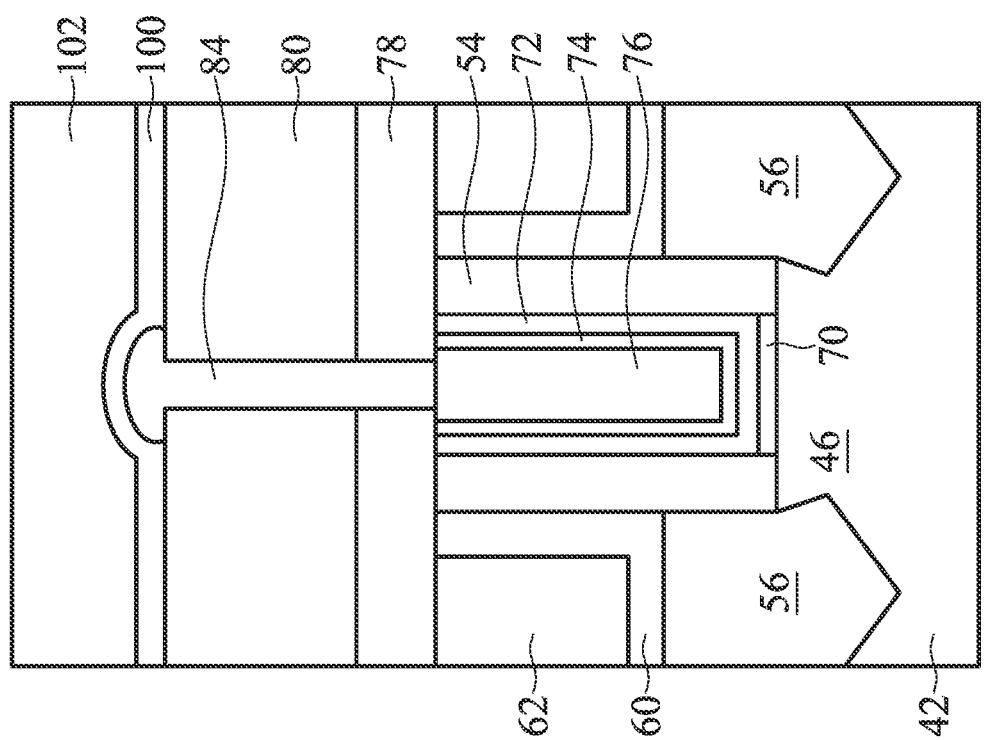

In FIG. 14, a barrier layer 100 is formed over the conductive feature 84 and remaining portions of the implanted second ILD 80i not covered by the conductive feature 84, and a blanket conductive layer 102 is then formed over the barrier layer 100, similar to FIG. 8.

Figure 15:
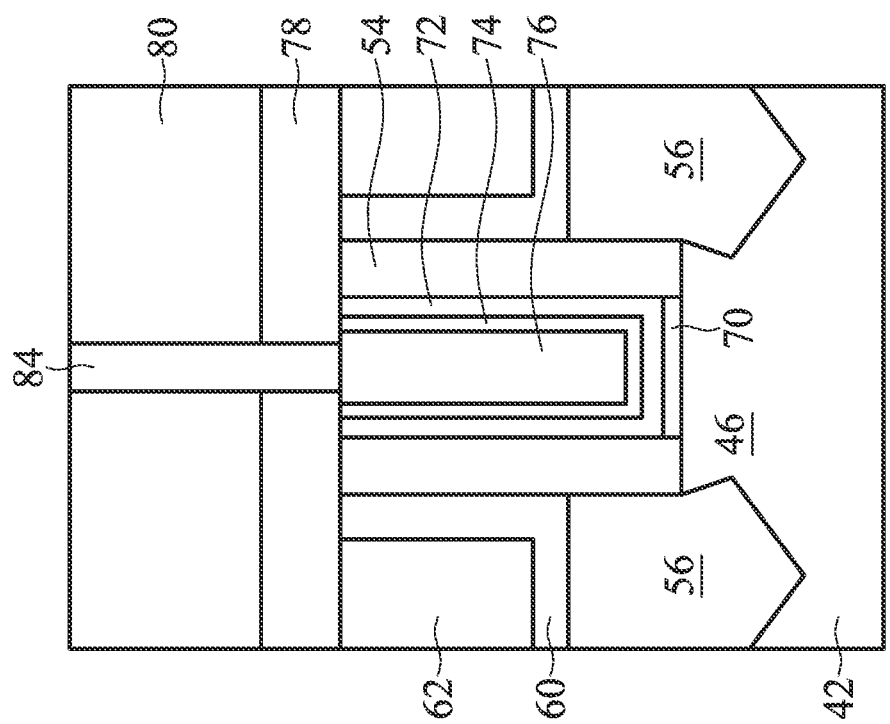

In FIG. 15, a first planarization process, such as a CMP, is performed to remove excess amount of the conductive layer 102, the barrier layer 100, and the overfill portion 84o of the conductive feature 84. Because the path to the underlying layer through the gaps 86 may be closed below the overfill portion 84o after the first implantation process, the CMP slurry can be prevented from penetrating gaps around the conductive feature 84, which can leave the underlying layer undamaged in the first planarization process.

Figure 16:
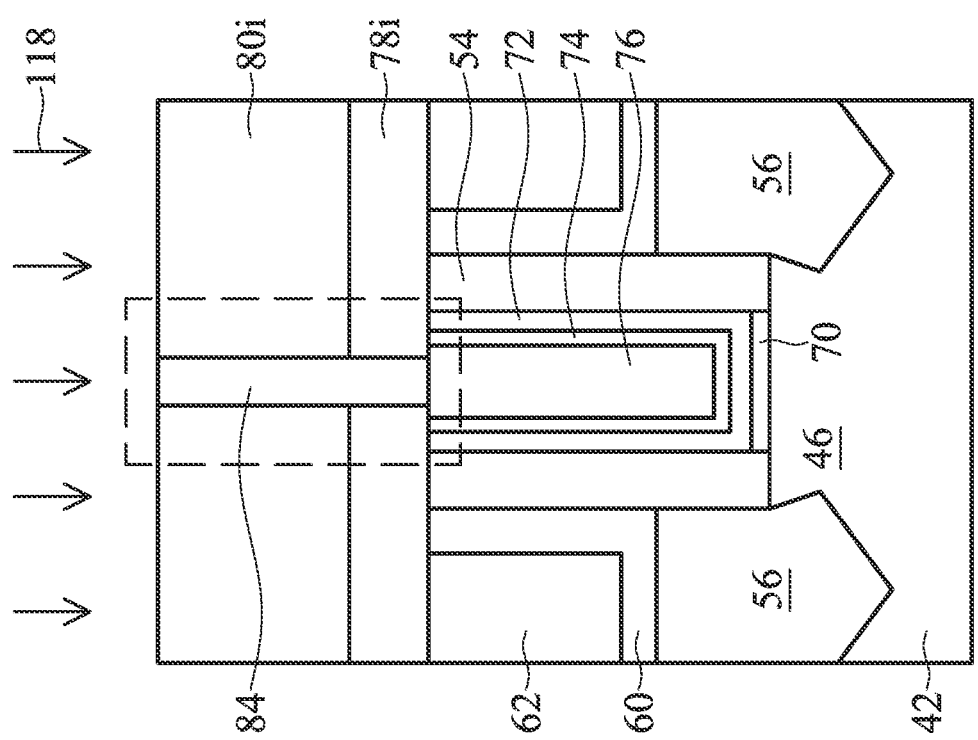

In FIG. 16, a second implantation process is performed to eliminate or reduce the gaps 86 between the conductive feature 84 and the surrounding dielectric material, such as the second ILD 80 and the ESL 78. The second implantation process is similar to the implantation process described with FIG. 7 except possibly at a lower energy level because the implanted species may be able to penetrate more easily into the dielectric material with the overfill portion 84o removed.

Ion beams 118 of one or more species of neutral elements, such as described above, are projected towards the dielectric material, such as the second ILD 80 and the ESL 78. In some embodiments, the second implantation process is performed at an energy level in a range from about 7 keV to about 56 keV depending on the design, such as the original thickness and final thickness of the second ILD 80. In some embodiments, the second implantation process is performed at a dosage level in a range from about $5\times10^{13}$ counts/cm$^2$ to about $5\times10^{16}$ counts/cm$^2$, which may depend on the dimension of gaps to be closed. In some embodiments, the second implantation process is performed at a temperature in a range from about −100° C. to about 450° C. Optionally, an anneal process is performed after the second implantation process to adjust a crystalline structure and reduce damage caused by the implantation process in the implanted layers.

Figure 18:
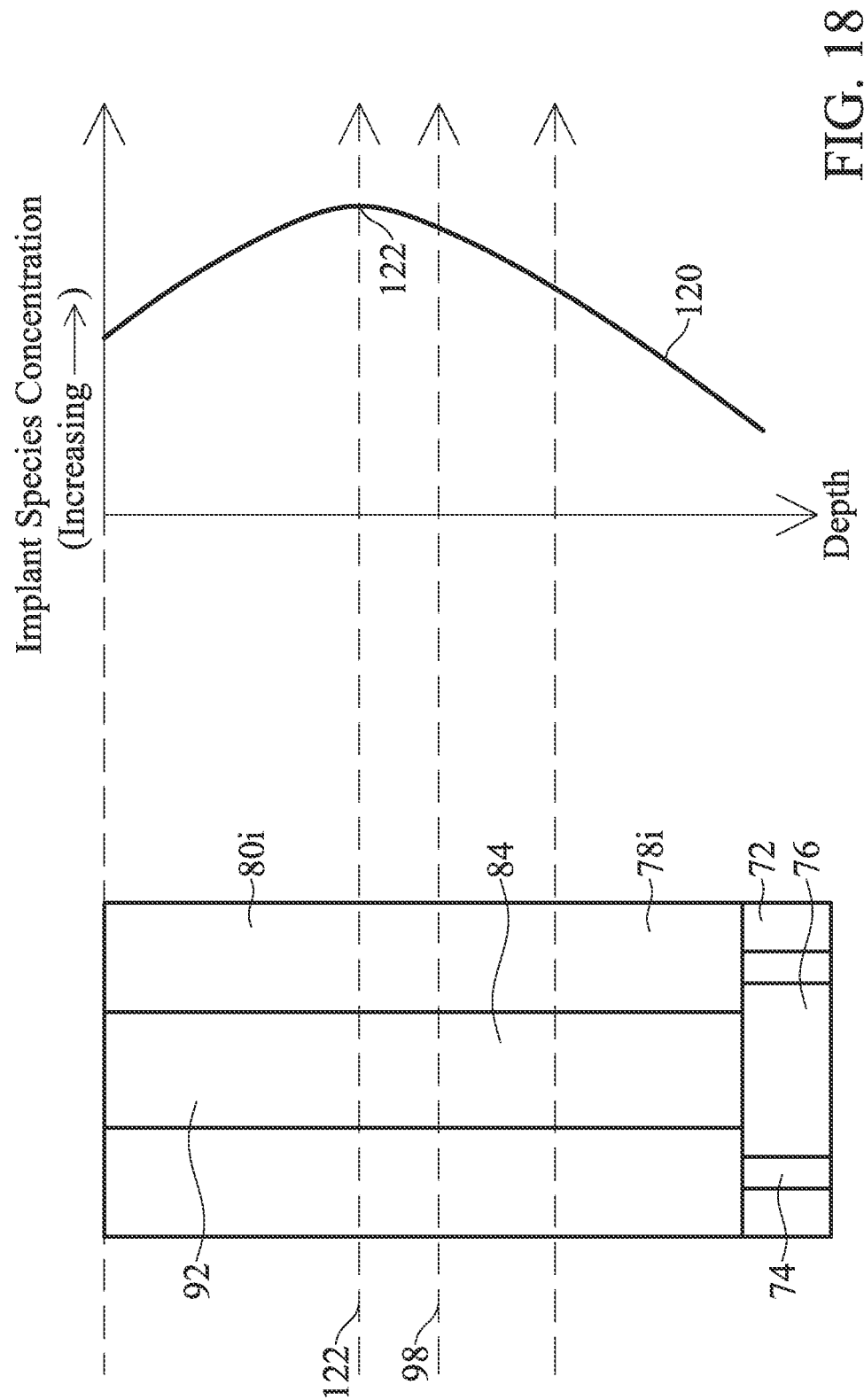
FIG. 18 is a partial enlarged view of FIG. 16.

FIG. 18 is a partial enlarged view of FIG. 16 showing the details around the conductive feature 84 after the second implantation process. The species implanted in the implanted second ILD 80i and the implanted ESL 78i cause the implanted second ILD 80i and the implanted ESL 78i to expand. The expansion can occur in all directions. As shown in FIG. 18, the expansion induces compression at the interface 92 between (i) the conductive feature 84 and (ii) the implanted second ILD 80i or implanted ESL 78i to close the gaps 86. The expansion can occur along the z-direction. In some embodiments, the expansion along the z-direction may be measured to indicate the overall amount of expansion thus determining the compression between the conductive feature 84 and the dielectric layers.

Concentration profile 120 is an example implant species concentration profile along the depth of the implanted second ILD 80i and the implanted ESL 78i according to some embodiments. Point 122 is peak concentration point where the implant species concentration is the highest and where the induced compression towards the conductive feature 84 is likely to be the highest. Line 98 indicates a depth level where a subsequent CMP process ends. The portion of the second ILD 80 under the line 98 remains in the device while the portion of the second ILD 80 above the line 98 is removed during the process. In some embodiments, the implantation process is designed so that the peak concentration point is at a depth level above the line 98. The configuration can ensure that the portion of the second ILD 80 interacting with the CMP slurry has high compression towards the conductive feature 84 to cut off the path of the slurry to the underlying layers.

After the second implantation process, a second planarization process, such as a CMP, is performed to remove excess amount of the conductive layer 102, the barrier layer 100, the implanted second ILD 80i, and the conductive feature 84, similar to the planarization process described in FIG. 9.

Even though the present disclosure is discussed in the context of forming a conductive feature to a gate conductive fill material, embodiments may be used in any situation where a conductive feature is formed in a dielectric layer without an adhesion layer and without a barrier layer, such as in forming contacts to active regions in a FinFET devices, forming metal plugs in intermetallization dielectric layers, or the like.

The present disclosure provides methods for forming conductive features in a dielectric layer without using adhesion layers or barrier layers and devices formed thereof. By not using the adhesion layers or barrier layers, resistance between the conductive features and the conductive material under the dielectric layer can be reduced. One or more implantations are performed to the dielectric layer after formation of the conductive feature to close gaps between the conductive features and the dielectric layer that may be caused by the absence of the barrier layer and/or adhesion layer. The implantation process can prevent layers under the dielectric layer and the conductive features from being exposed to process environments in the subsequent processes, such as CMP slurries, etch chemicals, and plasmas for etching, deposition or cleaning.

Some embodiments provide a structure comprising a dielectric layer over a substrate, and a conductive feature disposed through the dielectric layer. The dielectric layer has a lower surface near the substrate and a top surface distal from the substrate. The conductive feature is in direct contact with the dielectric layer, and the dielectric layer comprises an implant species. A concentration of the implant species in the dielectric layer has a peak concentration proximate the top surface of the dielectric layer, and the concentration of the implant species decreases from the peak concentration in a direction towards the lower surface of the dielectric layer.

Some embodiments provide a method for semiconductor processing. The method includes depositing a conductive feature in a dielectric layer. The conductive feature is in direct contact with the dielectric layer. The method further includes, after depositing the conductive feature, implanting an implant species into the dielectric layer, and after implanting the implant species, removing a portion of the conductive feature by a first planarization process.

Some embodiments provide a method for semiconductor processing. The method includes depositing a dielectric material over a substrate having a conductive material, forming an opening in the dielectric material to expose the conductive material, depositing a conductive feature in the opening and directly contacting the conductive material, performing a first implantation process to implant an implant species in the dielectric material, and after performing the first implantation process, performing a first planarization process to remove a portion of the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:
   depositing a dielectric layer over a substrate;
   depositing a conductive material in the dielectric layer, wherein the conductive material is in direct contact with the dielectric layer, wherein the dielectric layer has a lower surface facing the substrate and a top surface facing away from the substrate;
   after depositing the conductive material, implanting an implant species into the dielectric layer; and
   after implanting the implant species, removing a portion of the conductive material by a first planarization process, wherein the dielectric layer comprises the implant species extending from the top surface of the dielectric layer to the lower surface of the dielectric layer.

2. The method of claim 1, wherein the implant species is at least one of geranium, silicon, and nitrogen.

3. The method of claim 1, wherein removing a portion of the conductive material comprises removing an upper portion of the dielectric layer.

4. The method of claim 3, wherein after removing the upper portion of the dielectric layer, a peak concentration of the implant species in the dielectric layer is at the top surface of the dielectric layer.

5. The method of claim 1, wherein the conductive material has a uniform structure from a lower surface of the conductive material to an upper surface of the conductive material.

6. A method for semiconductor processing, the method comprising:
   depositing a dielectric layer over a substrate having a first conductive feature;
   forming an opening in the dielectric layer to expose the first conductive feature;
   depositing a second conductive feature in the opening and directly contacting the first conductive feature, wherein depositing the second conductive feature forms an overfill portion above the dielectric layer; and
   performing a first implantation process to implant an implant species in the dielectric layer, the implant species having a higher atomic volume than the dielectric layer, the second conductive feature having a first sidewall contacting the dielectric layer and a second sidewall contacting the dielectric layer, the first sidewall being opposite the second sidewall, the second conductive feature having a same material composition extending from the first sidewall to the second sidewall.

7. The method of claim 6, wherein depositing the second conductive feature comprises depositing a single material to completely fill the opening.

8. The method of claim 6, wherein, after performing the first implantation process, performing a first planarization process to remove a portion of the second conductive feature, wherein performing the first planarization process removes the overfill portion of the second conductive feature.

9. The method of claim 8, wherein, after performing the first planarization process, a peak concentration of the implant species is at an upper surface of the dielectric layer.

10. The method of claim 6, wherein a concentration of the implant species is in a range from $2 \times 10^{18}$ atoms/cm$^3$ to $6 \times 10^{20}$ atoms/cm$^3$.

11. The method of claim 10, wherein the implant species is germanium.

12. The method of claim 11, wherein the dielectric layer comprises a silicon oxide, silicon oxynitride, silicon oxycarbide, or a combination thereof.

13. The method of claim 6, wherein the first conductive feature is a gate electrode, and further comprising an etch stop layer between the first conductive feature and the dielectric layer.

14. The method of claim 13, wherein the implant species extends into the etch stop layer.

15. A method for semiconductor processing, the method comprising:
   depositing a dielectric material over a substrate and a first conductive feature;
   forming an opening in the dielectric material to expose the first conductive feature;
   filling the opening with a conductive material, wherein a gap is interposed between the conductive material and a sidewall of the opening; and
   performing a first implantation process to implant an implant species in the dielectric material and to narrow a width of the gap, the implant species being present in the dielectric material at an upper surface of the dielectric material and in the dielectric material at a lower surface of the dielectric material, a peak concentration of the implant species in the dielectric material being at the upper surface of the dielectric material.

16. The method of claim 15, further comprising:
   after performing the first implantation process, performing an anneal; and
   after performing the anneal, performing a first planarization process to remove a portion of the conductive material and an upper portion of the dielectric material.

17. The method of claim 15, wherein a peak concentration of the implant species is in a range from $8 \times 10^{18}$ atoms/cm$^3$ to $1 \times 10^{21}$ atoms/cm$^3$.

18. The method of claim 15, further comprising an etch stop layer, wherein the dielectric material is disposed over the etch stop layer, and the conductive material is disposed through the etch stop layer.

19. The method of claim 18, wherein the etch stop layer comprises the implant species, a concentration of the implant species in the etch stop layer being in a range from about $2 \times 10^{18}$ atoms/cm$^3$ to about $6 \times 10^{20}$ atoms/cm$^3$.

20. The method of claim 19, wherein the concentration of the implant species in the etch stop layer is highest at an interface with the dielectric material.

* * * * *